United States Patent
Hung et al.

(10) Patent No.: US 6,565,705 B2
(45) Date of Patent: May 20, 2003

(54) WAFER CARRIER USED FOR CHEMICAL MECHANIC POLISHING

(75) Inventors: Yung-Tai Hung, Chiayi (TW); Chi-Tung Huang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/050,019

(22) Filed: Jan. 15, 2002

(65) Prior Publication Data
US 2003/0070756 A1 Apr. 17, 2003

(30) Foreign Application Priority Data
Oct. 11, 2001 (TW) ........................... 90125046 A

(51) Int. Cl.7 ............................................. B24B 21/18
(52) U.S. Cl. ............................. 156/345.12; 156/345.14
(58) Field of Search ..................... 156/345.12, 345.14

(56) References Cited

U.S. PATENT DOCUMENTS

| | | | |
|---|---|---|---|
| 6,001,008 A | * 12/1999 | Fujimori et al. ............. 451/443 |
| 6,213,856 B1 | * 4/2001 | Cho et al. .................... 451/443 |
| 6,224,472 B1 | * 5/2001 | Lai et al. ..................... 451/288 |
| 6,231,428 B1 | * 5/2001 | Maloney et al. ............. 451/287 |
| 6,234,868 B1 | * 5/2001 | Easter et al. ................ 451/288 |
| 6,245,193 B1 | * 6/2001 | Quek et al. ............ 156/345.14 |
| 6,302,770 B1 | * 10/2001 | Aiyer ........................ 451/287 |
| 6,371,836 B1 | * 4/2002 | Brown et al. ............... 451/444 |

* cited by examiner

Primary Examiner—Benjamin L. Utech
Assistant Examiner—Sylvia R. MacArthur
(74) Attorney, Agent, or Firm—J.C. Patents

(57) ABSTRACT

A wafer carrier used for a chemical mechanical device has a polishing head and a pad conditioner. The polishing head has a retainer ring secured to a bottom of the polishing head to hold a wafer. The pad conditioner can be fixed on a surface of the retainer ring, attached to side surfaces of the retainer ring, or embedded in the retainer ring, such that the pad conditioner and the polishing head can be integrally formed.

6 Claims, 4 Drawing Sheets

WAFER CARRIER USED FOR CHEMICAL MECHANIC POLISHING

CROSS-REFERENCE TO RELATED APPLICATION

This application claims the priority benefit of Taiwan application serial no. 90125046, filed Oct. 11, 2001.

BACKGROUND OF THE INVENTION

1. Field of the Invention

The present invention relates to a chemical mechanical polishing (CMP) device. More specifically, the present invention relates to a CMP device having a wafer carrier.

2. Description of the Related Art

A chemical mechanical polishing method is a technology that can provide global planarization by using a polishing tool and an appropriate reagent.

FIG. 1 is a schematic side view of a conventional chemical mechanical polishing (CMP) device. FIG. 2 is a schematic top view of a conventional CMP device.

With reference to FIGS. 1 and 2, the conventional CMP device includes a polishing table 100, a wafer carrier 106, a polishing pad 102, a tube 110, and a pad conditioner 108. The wafer carrier 106 is used to hold a wafer 104 to be polished. The carrier 106 has a vacuum hole (not shown) for sucking the wafer 104 and has a retainer ring (not shown) for supporting the wafer 104. The polishing pad 102 is arranged on the polishing table 100. The tube 110 conveys a polishing slurry 110a to the polishing pad 102. The pad conditioner 108 has a plurality of diamond grits to scrape against the surface of the polishing pad 102 so as to remove the polishing slurry remained in the polishing pad 102. During the CMP process, the polishing table 100 and the wafer carrier 106 rotates in a predetermined direction and the wafer carrier 106 catches a back surface 104a of the wafer 104, with the front surface 104b of the wafer 104 being pressed on the polishing pad 102. The tube 110 continuously supplies the polishing slurry 110a to the polishing pad 102, such that a chemical reaction between the front surface 104b of the wafer 104 and the reagent in the polishing slurry 110a occurs while the pad 102 contacts with protruding portions on the wafer. Meanwhile, the polishing pad 102 mechanically polishes the wafer 104 by using the abrasive grains in the polishing slurry 110a to remove the protruding portions on the wafer. After the chemical and mechanical polishing process repeats several times, a smooth surface can be obtained.

In general, the polishing pad has a plurality of pits thereon which help to convey the polishing slurry and to polish the wafer. The pits have an average depth of 1–2 microns. However, the depth of the pit decreases as the number of the polished wafer increases, which may degrade the polishing performance. Further, during polishing, the pit of the polishing pad can be filled by the abrasive grains in the polishing slurry or the polished-off substance from the wafer such that the polishing characteristics disappear. Therefore, a pad conditioner 108 is needed for removing the fillings of the pits so as to recover the polishing characteristics, such as uneven surface of the pad 102.

However, the conventional CMP device has a discrete wafer carrier and a separate pad conditioner, which requires more space. Furthermore, it is difficult to maintain a conventional CMP device that has complicate configuration.

SUMMARY OF THE INVENTION

In one aspect of the present invention, a wafer carrier used for CMP consists of a wafer carrier and a pad conditioner, in which the space and the maintenance fee for the CMP device can be effectively reduced.

In order to achieve the above and other objects of the present invention, a wafer carrier having a polishing head and a pad conditioner is provided. The polishing head has a retainer ring at a bottom thereof to hold a wafer. The pad conditioner is fixed on one surface of the retainer ring. The pad conditioner can be in contact with one of the polishing pads of the chemical mechanical device.

Furthermore, a wafer carrier used for a chemical mechanical device comprising a polishing head and a pad conditioner is provided. The polishing head has a retainer ring at a bottom thereof to hold a wafer in the bottom of the polishing head. The pad conditioner is attached to side surfaces of the polishing head. One conditioning surface of the pad conditioner is roughly parallel to one surface of the retainer ring. The pad conditioner can be in contact with one of the polishing pads of the chemical mechanical device.

Also, a wafer carrier used for a chemical mechanical device comprising a polishing head and a pad conditioner is provided. The polishing head has a retainer ring at a bottom thereof to hold a wafer. The pad conditioner is embedded in the retainer ring. The pad conditioner can be in contact with one of the polishing pads of the chemical mechanical device.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENT

Reference will now be made in detail to the present preferred embodiments of the invention, examples of which are illustrated in the accompanying drawings. Whenever

First Embodiment

Figure 1:
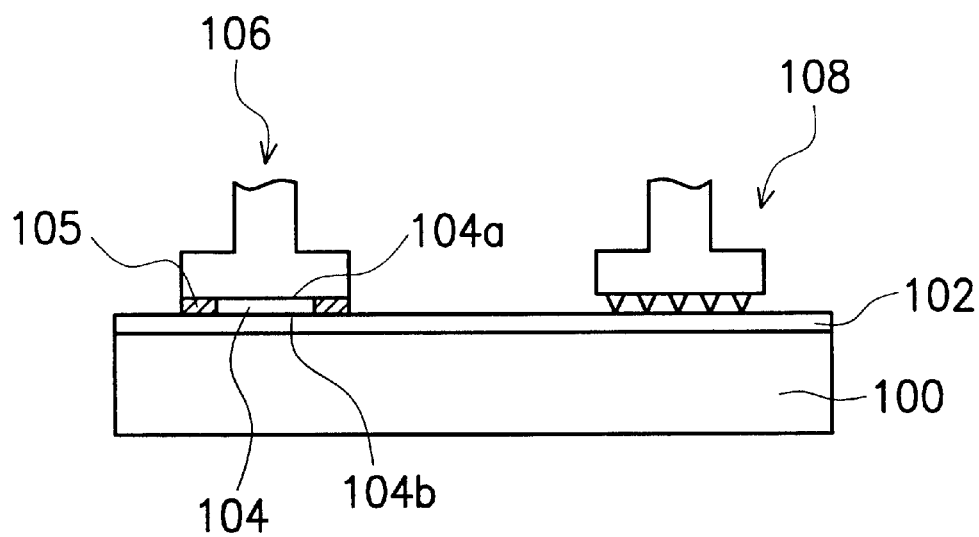
FIG. 1 is a schematic side view of a conventional chemical mechanical polishing (CMP) device.
Figure 2:
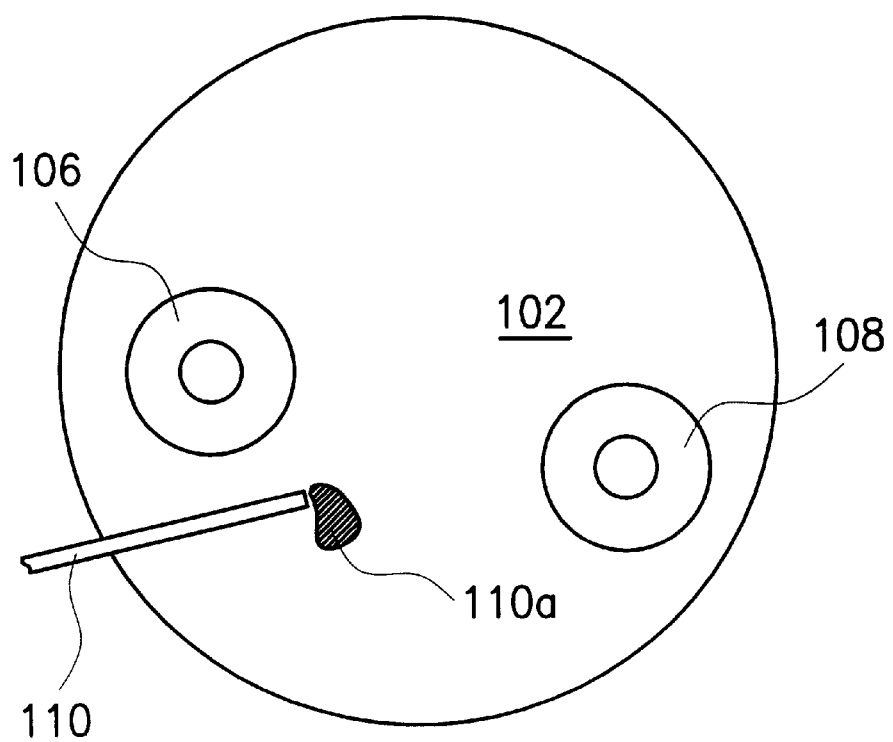
FIG. 2 is a schematic top view of a conventional CMP device.
Figure 3:
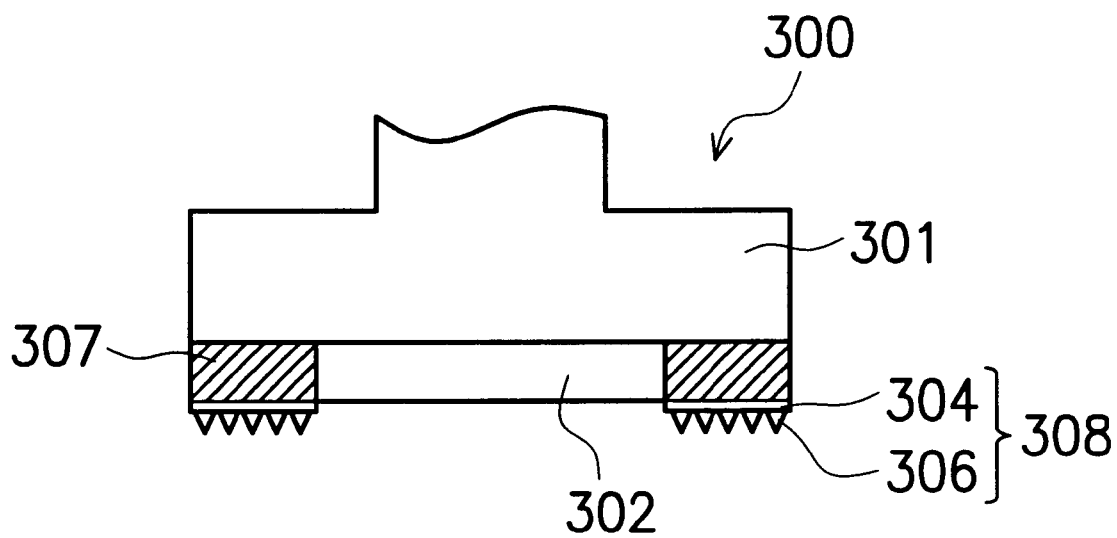
FIG. 3 is a schematic view of a wafer carrier of a CMP device according to a first preferred embodiment of the present invention.
Figure 4:
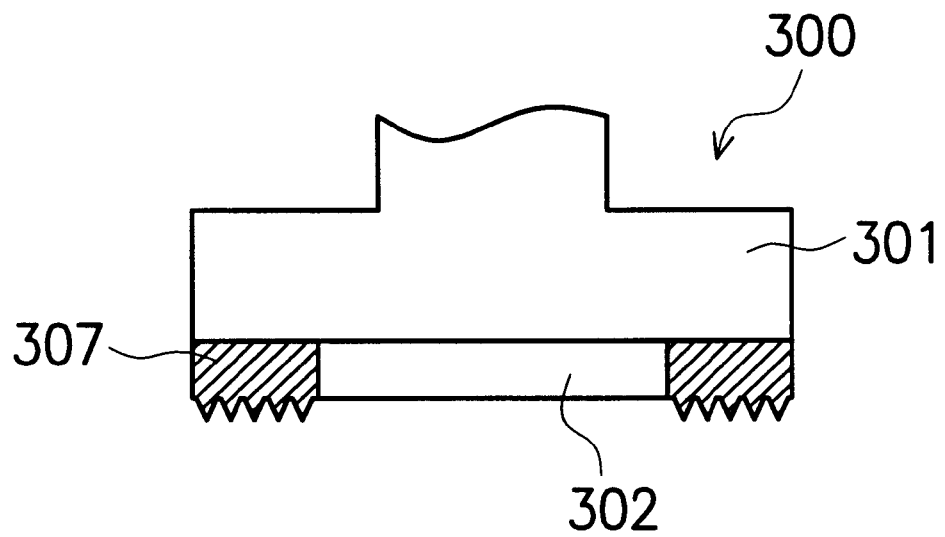
FIG. 4 is a schematic view of a wafer carrier of a CMP device according to another first preferred embodiment of the present invention.

FIGS. 3 and 4 show a wafer carrier used for CMP according to a first preferred embodiment of the present invention.

With reference to FIG. 3, the wafer carrier 300 includes a polishing head 301 and a pad conditioner 308. The polishing head 301 holds a wafer 302 in a retainer ring 307 at a bottom of the polishing head 301. The pad conditioner 308 is fixed on one surface of the retainer ring 307. The wafer carrier 300 further includes a resilient porous film (not shown) which presses the wafer 302 into the porous film in a wet state for supporting the wafer 302. Alternatively, a wafer carrier 300 further includes a vacuum hole (not shown) to suck the wafer 302 while a nitrogen gas is charged, such that the polishing rates at the center and edge of the wafer can be fine tuned. Moreover, a floating retainer ring (not shown) can be used to transfer the stress at the edge of the wafer 302 thereto, while pneumatically contacting with the polishing pad.

In this embodiment, the pad conditioner 308 consists of a conditioning plate 304 and a plurality of grains 306. The conditioning plate 304 is fixed on one surface of the retainer ring 307. The conditioning plate 304 has such a thickness that the polishing of the wafer 302 is not adversely affected. The grains 306 are arranged in the conditioning plate 304, each of which is partly exposed. The grains 306 can be formed of diamond or ceramic, for example.

As shown in FIG. 4, patterns or grains can be further provided on the bottom of the retainer ring 306. In this case, the retainer ring 306 can be used instead the pad conditioner 308.

The pad conditioner 308 or the retainer ring 307 having patterns or grains thereon comes into contact with the polishing pad to remove the substance in the pits and to recover the polishing characteristics while polishing the wafer.

Second Embodiment

Figure 5:
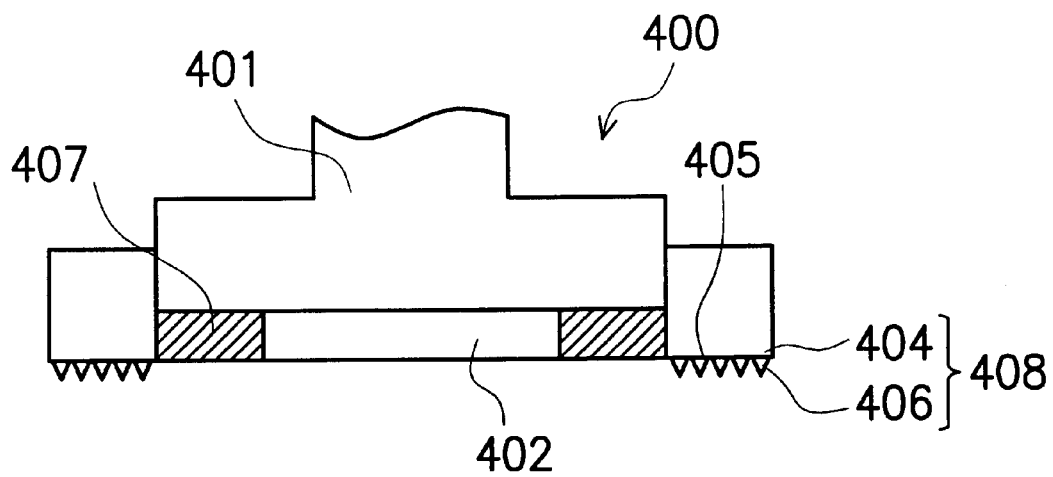
FIG. 5 is a schematic view of a wafer carrier of a CMP device according to a second preferred embodiment of the present invention.
Figure 6:
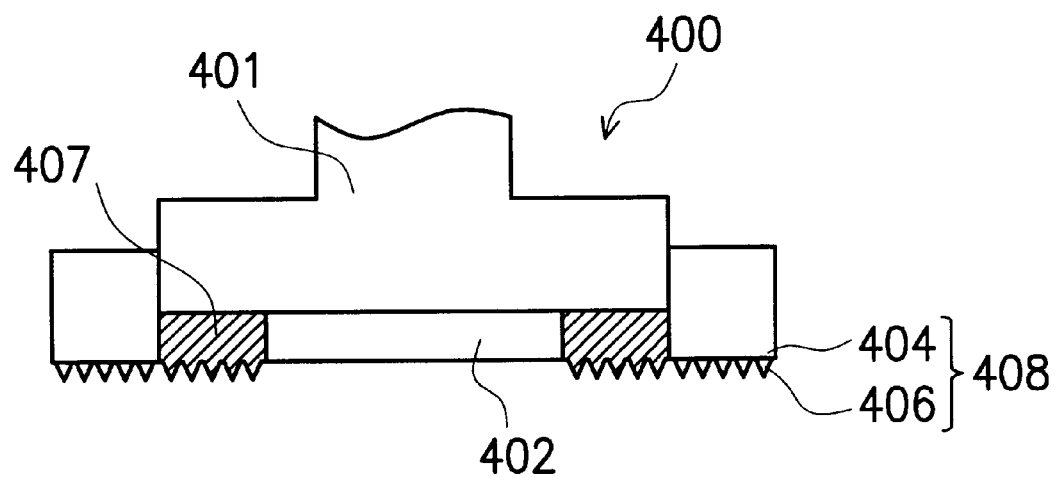
FIG. 6 is a schematic view of a wafer carrier of a CMP device according to another second preferred embodiment of the present invention.

FIGS. 5 and 6 show a CMP device having a wafer carrier according to a second embodiment of the present invention.

With reference to FIG. 5, a wafer carrier 400 includes a polishing head 401 and a pad conditioner 408. A wafer 402 is hold in a retainer ring 407 at a bottom of the polishing head 401. The pad conditioner 408 attaches to a side of the polishing head 401 and a conditioning surface 405 of the pad conditioner 408 is parallel to the retainer ring 407. Preferably, the conditioning surface 405 of the pad conditioner 408 is at the same level as the surface 407 of the polishing head 401. The wafer carrier 400 further includes a resilient porous film (not shown) which presses the wafer 402 into the porous film in a wet state for supporting the wafer 402. Alternatively, a wafer carrier 400 further includes a vacuum hole (not shown) to suck the wafer 402 while a nitrogen gas is charged, such that the polishing rates at the center and edge of the wafer can be fine tuned. Moreover, a floating retainer ring (not shown) can be used to transfer the stress at the edge of the wafer 402 thereto, while pneumatically contacting with the polishing pad.

In this embodiment, the pad conditioner 408 consists of a lug 404 and a plurality of grains 406. The lug 404 attaches to the side of the polishing head 401. The grains 406 are arranged in the lug 404, each of which is partly exposed. The grains 406 can be formed of diamond or ceramic, for example.

As shown in FIG. 6, patterns or grains can be further provided on the bottom of the retainer ring 407. In this case, the retainer ring 407 can provide the same function as the pad conditioner 408 during operation.

The pad conditioner 408 or the retainer ring 407 having patterns or grains thereon comes into contact with the polishing pad to remove the substance in the pits and to recover the polishing characteristics while polishing the wafer.

Third Embodiment

Figure 7:
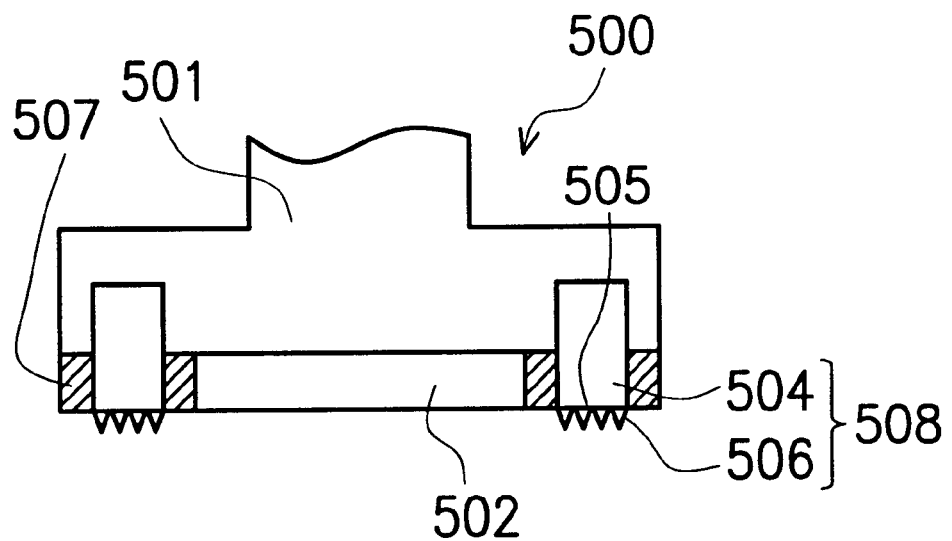
FIG. 7 is a schematic view of a wafer carrier of a CMP device according to a third preferred embodiment of the present invention.
Figure 8:
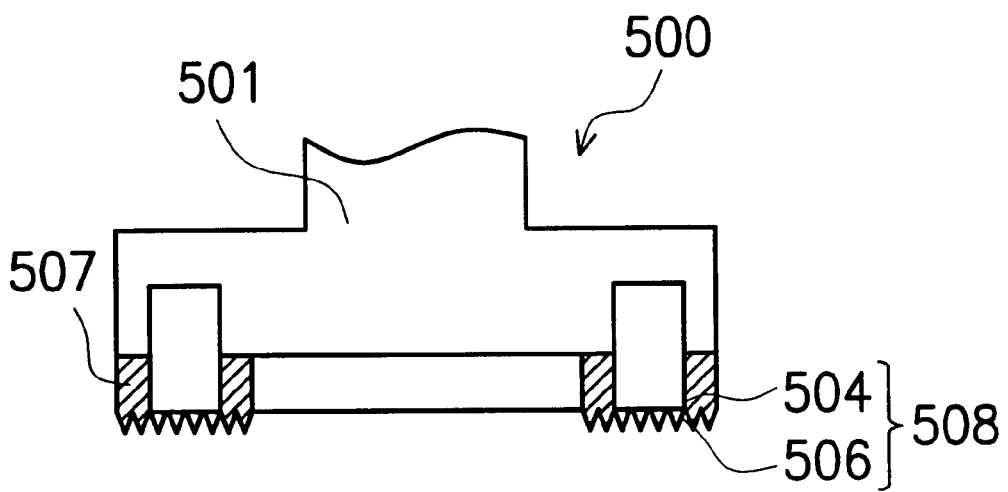
FIG. 8 is a schematic view of a wafer carrier of a CMP device according to another third preferred embodiment of the present invention.

FIGS. 7 and 8 show a CMP device according to a third preferred embodiment of the present embodiment.

With reference to FIG. 7, the wafer carrier 500 includes a polishing head 501 and a pad conditioner 508. A wafer 502 is hold in the retainer ring 507 at a bottom of the polishing head 501. The wafer carrier 500 further includes a resilient porous film (not shown) which presses the wafer 502 into the porous film in a wet state for supporting the wafer 502. Alternatively, a wafer carrier 500 further includes a vacuum hole (not shown) to suck the wafer 502 while a nitrogen gas is charged, such that the polishing rates at the center and edge of the wafer can be fine tuned. Moreover, a floating retainer ring (not shown) can be used to transfer the stress at the edge of the wafer 502 thereto, while pneumatically contacting with the polishing pad.

In this embodiment, the pad conditioner 508 consists of a lug 504 and a plurality of grains 506. The lug 504 is embedded in one surface of the retainer ring 507. The grains 506 are arranged in the lug 504, each of which is partly exposed. The grains 506 can be formed of diamond or ceramic, for example.

As shown in FIG. 8, patterns or grains can be further provided on the bottom of the retainer ring 507. In this case, the retainer ring 507 can provide the same function as the pad conditioner 508 during operation.

The pad conditioner 508 or the retainer ring 507 having patterns or grains thereon comes into contact with the polishing pad to remove the substance filled in the pits and to recover the polishing characteristics while polishing the wafer.

In the present invention, the pad conditioner can be fixed on the surface of the retainer ring at the bottom of the polishing head, on the side of the polishing head, or embedded in the surface of the retainer ring. The polishing head and the pad conditioner can be thus combined.

With a combination of the wafer carrier and the pad conditioner, the space for the CMP device can be effectively utilized. Therefore, the maintenance fee can be reduced. Furthermore, the polishing pad can preserve the polishing characteristics while the wafer carrier is polished.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer carrier used for a chemical mechanical polishing device, comprising:

a polishing head has a retainer ring at a bottom thereof for holding a wafer, and a pad conditioner that is embedded in a surface of the retainer ring, wherein the pad conditioner comprises a lug and a plurality of grains embedded in the lug, with the grains being partly exposed.

2. The wafer carrier of claim 1, wherein the lug has a conditioning surface parallel to the surface of retainer ring.

3. The wafer carrier of claim 2, wherein the grains are formed of a material selected from a group consisting of diamond and ceramic.

4. The wafer carrier of claim 1, wherein patterns are further provided on a bottom surface of the retainer ring, such that the retainer ring is used instead of the pad conditioner.

5. The wafer carrier of claim 1, wherein grains are further provided on a bottom surface of the retainer ring, such that the retainer ring is used instead of the pad conditioner.

6. The wafer carrier of claim 1, further comprising a floating retainer ring to support the wafer and transfer the stress at the edge of the wafer to the floating retainer ring.

* * * * *